(12) United States Patent
Kim et al.

(10) Patent No.: US 8,399,284 B2
(45) Date of Patent: Mar. 19, 2013

(54) METHOD OF MANUFACTURING THE ORGANIC LIGHT-EMITTING DISPLAY

(75) Inventors: Seong-Min Kim, Yongin (KR); Jae-Kook Ha, Yongin (KR); Jin-Koo Chung, Yongin (KR); Jun-Ho Choi, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/178,394

(22) Filed: Jul. 7, 2011

(65) Prior Publication Data
US 2012/0049207 A1    Mar. 1, 2012

(30) Foreign Application Priority Data
Aug. 27, 2010  (KR) .......................... 10-2010-0083703

(51) Int. Cl.
*H01L 21/00*    (2006.01)
(52) U.S. Cl. ........................................... 438/82; 257/72
(58) Field of Classification Search .................. 438/24, 438/22, 82, 149; 257/59, 72, 80, 79
See application file for complete search history.

(56) References Cited

U.S. PATENT DOCUMENTS

| | | | |
|---|---|---|---|
| 6,784,009 B2 | 8/2004 | Lim et al. | |
| 7,161,184 B2 * | 1/2007 | Miyagi et al. | 257/88 |
| 7,279,708 B2 * | 10/2007 | Kwak et al. | 257/59 |
| 7,557,382 B2 * | 7/2009 | Koh et al. | 257/82 |
| 7,816,161 B2 * | 10/2010 | Park et al. | 438/34 |
| 8,158,447 B2 * | 4/2012 | Park et al. | 438/34 |
| 8,258,523 B2 * | 9/2012 | Lee et al. | 257/91 |
| 2007/0102714 A1 * | 5/2007 | Lee et al. | 257/88 |

FOREIGN PATENT DOCUMENTS

| | | |
|---|---|---|
| JP | 11-087063 A | 3/1999 |
| KR | 10-2005-0094305 A | 9/2005 |
| KR | 10-2006-0084112 A | 7/2006 |
| KR | 10-2007-0050797 A | 5/2007 |

* cited by examiner

*Primary Examiner* — Thao P. Le
(74) *Attorney, Agent, or Firm* — Knobbe Martens Olson & Bear LLP

(57) ABSTRACT

A thin film deposition apparatus, which has high external light transmittance and a cathode having a uniform thickness, is disclosed. In one embodiment, the thin film deposition apparatus includes a deposition source spaced apart from a center of the substrate and configured to emit a deposition material toward the substrate and a blocking member disposed on the substrate and configured to block at least part of the deposition material emitted from the deposition source, wherein an opening is defined on at least one side of the blocking member.

8 Claims, 3 Drawing Sheets

METHOD OF MANUFACTURING THE ORGANIC LIGHT-EMITTING DISPLAY

CROSS-REFERENCE TO RELATED PATENT APPLICATION

This application claims the benefit of Korean Patent Application No. 10-2010-0083703, filed on Aug. 27, 2010, in the Korean Intellectual Property Office, the disclosure of which is incorporated herein in its entirety by reference.

BACKGROUND

1. Field

The described technology generally relates to a thin film deposition apparatus, an organic light-emitting display manufactured by using the thin film deposition apparatus, and a method of manufacturing the organic light-emitting display.

2. Description of the Related Technology

Since organic light-emitting displays have excellent characteristics in terms of viewing angles, contrast, response speeds, and power consumption, the organic light-emitting displays are widely used from personal portable devices, such as MP3players and mobile phones, to TVs.

There have been attempts to form a transparent display by disposing a transparent thin-film transistor or a transparent light-emitting device in an organic light-emitting display.

However, since a cathode is formed of a metal, improving transmittance of the transparent display is limited.

SUMMARY

One invention aspect is a thin film deposition apparatus that forms a penetration unit in a panel so as to penetrate light while securing a uniform thickness of a deposited cathode, an organic light-emitting display manufactured by using the thin film deposition apparatus, and a method of manufacturing the organic light-emitting display.

Another aspect is a thin film deposition apparatus, which has high external light transmittance and a cathode having a uniform thickness, an organic light-emitting display manufactured by using the thin film deposition apparatus, and a method of manufacturing the organic light-emitting display.

Another aspect is a thin film deposition apparatus, which is capable of patterning a cathode using a simple method, an organic light-emitting display manufactured by using the thin film deposition apparatus, and a method of manufacturing the organic light-emitting display.

Another aspect is a thin film deposition apparatus for forming a thin film on a substrate, the thin film deposition apparatus including: a deposition source spaced apart from a center of the substrate and emitting a deposition material toward the substrate; and a blocking member disposed on the substrate, including an opening on at least one side, and blocking at least a part of the deposition material emitted from the deposition source.

The blocking member may have a fan shape.

The opening may be formed on the blocking member in such a way that a distance from the opening to the deposition source is a maximum.

The substrate may be relatively rotatable with respect to the deposition source.

The blocking member may maintain a fixed location with respect to the deposition source.

The deposition material emitted from the deposition source may be deposited on the substrate at an angle less than 90° with respect to a deposition surface of the substrate.

The blocking member may only pass a part of the deposition material emitted from the deposition source therethrough, the part of the deposition material being incident on the substrate at an angle less than a predetermined angle with respect to a deposition surface of the substrate.

Another aspect is an organic light-emitting display including: a substrate; a plurality of pixels formed on the substrate and each having a first area emitting light and a second area through which light penetrates; a plurality of pixel circuit units disposed in the first area of each of the plurality of pixels, and each including at least one thin-film transistor; a plurality of first electrodes disposed in the first area of each of the plurality of pixels, respectively electrically connected to the plurality of pixel circuit units, and patterned in an island form so as to be separated from each other in each of the plurality of pixels; a plurality of organic layers disposed to cover at least a part of each of the plurality of first electrodes, and each including a light-emitting layer; a plurality of spacers disposed between the neighboring organic layers; and a second electrode disposed to cover the plurality of organic layers and at least a part of the plurality of spacers, and including an opening on at least one side of each of the plurality of spacers.

A length of a first surface of each of the plurality of spacers may be shorter than a length of a second surface of each of the plurality of spacers, wherein the first surface faces the substrate and the second surface may be opposite to the first surface.

The opening may be formed on at least a part of a bottom of the second surface.

The opening may be formed on at least a part of the second area.

The organic light-emitting display may further include a plurality of pixel defining layers disposed to cover an edge of each of the first electrodes, wherein the plurality of spacers may be formed on each of the plurality of pixel defining layers.

The opening may be formed on at least one side of an area where each of the plurality of pixel defining layers and each of the plurality of spacers contact each other.

The opening may be formed between each of the plurality of organic layers and each of the plurality of spacers.

The opening may be formed only at one predetermined side of each of the spacers, on each of the plurality of pixels.

The plurality of spacers may block a part of a deposition material deposited on the substrate to form the second electrode.

Another aspect is a method of manufacturing an organic light-emitting display, the method including: dividing each of a plurality of pixels disposed on a substrate into a first area emitting light and a second area through which external light penetrates; forming a plurality of pixel circuit units, each including at least one thin-film transistor, on the first area of each of the plurality of pixels; forming a plurality of first electrodes on the first area of each of the plurality of pixels, which are respectively electrically connected to each of the plurality of pixel circuit units and are patterned in an island form so as to be separated from each other in each of the plurality of pixels; forming a plurality of organic layers so as to cover at least a part of each of the plurality of first electrodes, and each including a light-emitting layer; forming a plurality of spacers between the neighboring organic layers; and depositing a deposition material on the first and second areas to form a second electrode including an opening on at least one side of each of the plurality of spacers.

The depositing of the deposition material may include depositing a deposition material emitted from a deposition source that is spaced apart from a center of the substrate on the first and second areas.

The depositing of the deposition material may include depositing the deposition material while the substrate relatively rotates with respect to the deposition source.

The depositing of the deposition material may include depositing the deposition material such that a part of the deposition material emitted from the deposition source is blocked by a blocking member.

The depositing of the deposition material may include depositing the deposition material while the blocking member maintains a fixed location with respect to the deposition source.

The blocking member may have a fan shape and comprises an opening on at least one side of the blocking member, wherein the opening may be disposed in such a way that a distance between the opening and the deposition source is a maximum.

The blocking member may only pass through a part of the deposition material emitted from the deposition source, which is incident on the substrate at an angle less than a predetermined angle with respect to a deposition surface of the substrate.

The deposition material emitted from the deposition source may be deposited on the substrate at an angle less than 90° with respect to a deposition surface of the substrate, wherein at least a part of the deposition material incident on the substrate is blocked by the plurality of spacers.

DETAILED DESCRIPTION

Hereinafter, embodiments will be described more fully with reference to the accompanying drawings.

Figure 1:
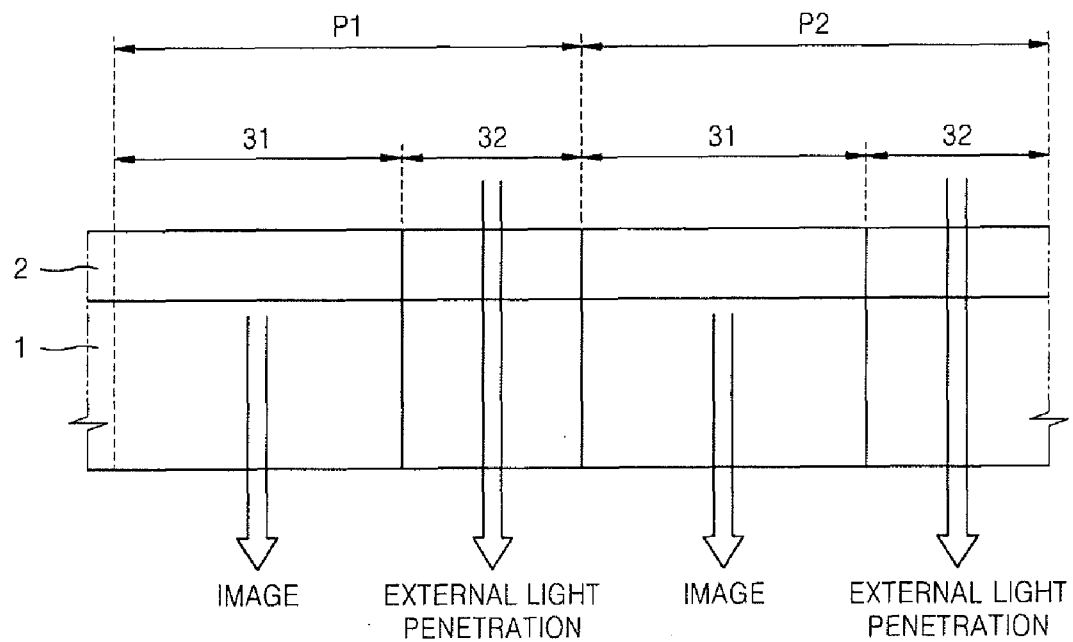
FIG. 1 is a cross-sectional view of a first pixel and a second pixel, which are adjacent pixels, of an organic light emitting display, according to an embodiment.

FIG. 1 is a cross-sectional view schematically illustrating an organic light-emitting display according to an embodiment.

Referring to FIG. 1, the organic light-emitting display includes a substrate 1 and a display unit 2 disposed on the substrate 1.

In the organic light-emitting display, external light penetrates through the substrate 1 and the display unit 2.

As will be described later, the display unit 2 is manufactured in such a way that external light passes through the display unit 2, and referring to FIG. 1, the display unit 2 is disposed in such a way that a user, who is located where an image is realized, is able to observe an external image of the lower substrate 1. The organic light-emitting display of FIG. 1 is a bottom emission type display, wherein an image of the display unit 2 is realized toward the substrate 1, but the organic light-emitting display may be a top emission type display, wherein the image of the display unit 2 is realized in an opposite direction from the substrate 1.

FIG. 1 illustrates a first pixel P1 and a second pixel P2, which are adjacent pixels, of the organic light-emitting display.

The first and second pixels P1 and P2 each include a first area 31 and a second area 32.

An image is realized from the display unit 2 through the first area 31, and external light penetrates through the second area 32.

For example, the first and second pixels P1 and P2 both include the first area 31 that realizes the image, and the second area 32 through which the external light penetrates, and thus, the user is able to view an external image when not looking at the image through the first area 31.

Here, devices, such as a thin-film transistor, a capacitor, an organic light emitting device, etc, may not be formed in the second area 32 so as to increase external light transmittance and reduce distortion generated as the external image is interrupted by the devices.

Figure 2:
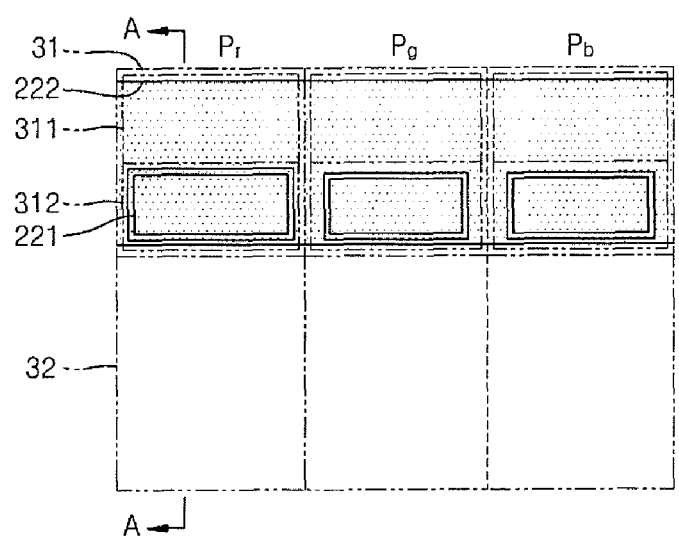
FIG. 2 is a plan view of a red pixel, a green pixel, and a blue pixel, which are adjacent to each other, of an organic light-emitting display, according to an embodiment.
Figure 3:
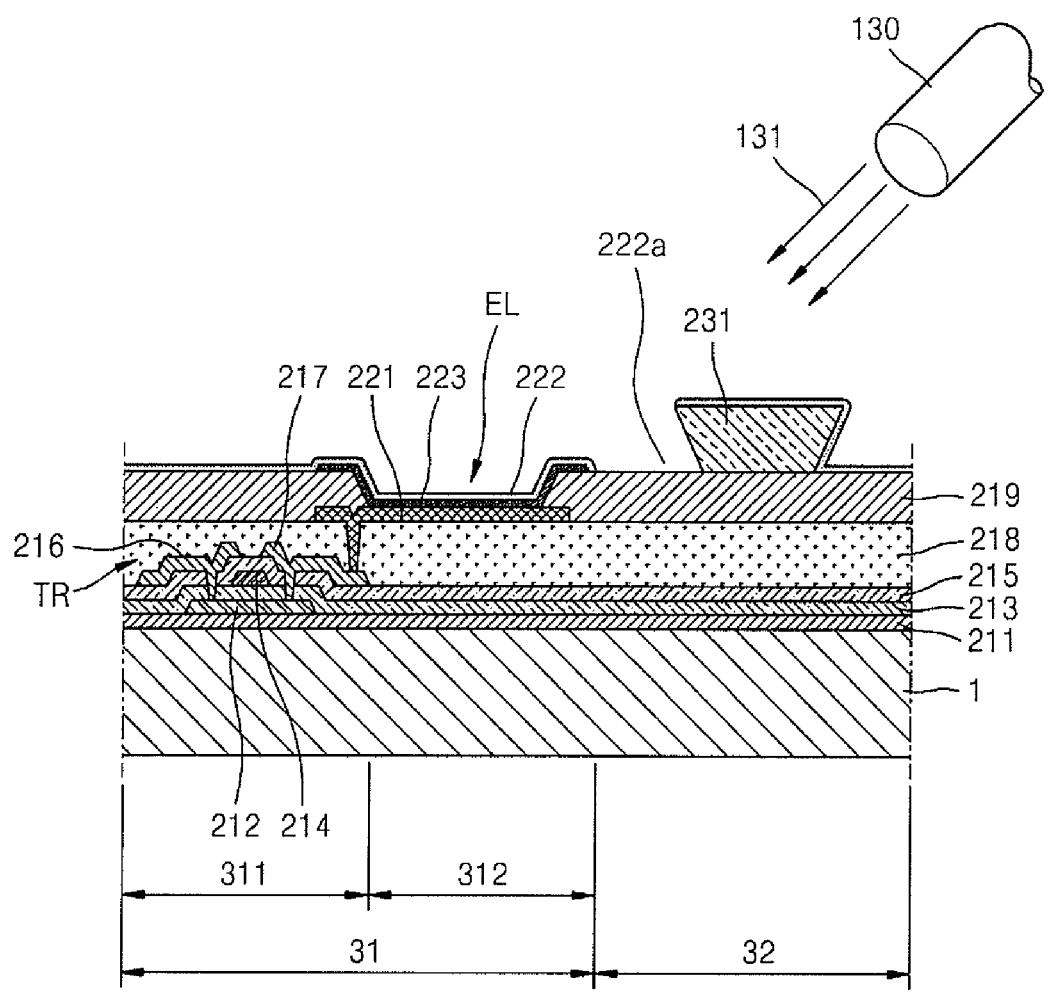
FIG. 3 is a cross-sectional view taken along a line A-A of FIG. 2.

FIG. 2 is a plan view of a red pixel Pr, a green pixel Pg, and a blue pixel Pb, which are adjacent to each other, of the organic light-emitting display, according to an embodiment, and FIG. 3 is a cross-sectional view taken along a line A-A of FIG. 2.

Each of the red, green, and blue pixels Pr, Pg, and Pb includes a circuit area 311 and a light-emitting area 312 in the first area 31. The circuit area 311 and the light-emitting area 312 are disposed adjacent to each other.

The second area 32 for external light to penetrate is disposed adjacent to the first area 31.

As shown in FIG. 2, the second area 32 may be independently included according to the red, green, and blue pixels Pr, Pg, and Pb. Alternatively, although not illustrated, the second area 32 may be commonly connected to each of the red, green, and blue pixels Pr, Pg, and Pb. If the second area 32 is connected to each of the red, green, and blue pixels Pr, Pg, and Pb, the area of the second area 32 through which the external light penetrate is increased, and thus transmittance of the display unit 2 may be increased.

In one embodiment, as shown in FIG. 3, a pixel circuit unit including a thin-film transistor TR is disposed in the circuit area 311. Here, the number of thin-film transistors TR included in the pixel circuit unit is not limited to one as shown in FIG. 3. Besides the thin-film transistor TR, the pixel circuit unit may further include a plurality of thin-film transistors, a plurality of storage capacitors, and wires, such as scan lines, data lines, and Vdd lines connected to the thin-film transistors and storage capacitors.

An organic light-emitting device EL constituting a light-emitting device is disposed in the light-emitting area 312. The organic light-emitting device EL is electrically connected to the thin-film transistor TR of the pixel circuit unit. A buffer layer 211 is disposed on the substrate 1, and the pixel circuit unit including the thin-film transistor TR is disposed on the buffer layer 211. A semiconductor active layer 212 is disposed on the buffer layer 211.

In one embodiment, the buffer layer 211 is formed of a transparent insulating material. The buffer layer 211 may be formed of any material that prevents impure elements from penetrating into the substrate 1 and may planarize a surface of the substrate 1. For example, the buffer layer 211 may be formed of an inorganic material, such as silicon oxide, silicon nitride, silicon oxynitride, aluminum oxide, aluminum nitride, titanium oxide, or titanium nitride, an organic material, such as polyimide, polyester, or acryl, or a stack structure of the inorganic material and the organic material. The buffer layer 211 may be omitted depending on the embodiment.

The semiconductor active layer 212 may be formed of polycrystalline silicon, but a material for forming the semiconductor active layer 212 is not limited thereto, and may be an oxide semiconductor. For example, the semiconductor active layer 212 may be a G—I—Z—O layer [(In2O3)a (Ga2O3)b(ZnO)c layer], wherein a, b, and c are each a real number satisfying a≧0, b≧0, and c>0. When the semiconductor active layer 212 is formed of an oxide semiconductor, light transmittance in the circuit area 311 of the first area 31 may be increased and thus external light transmittance of the display unit 2 may be increased.

A gate insulation layer 213 is disposed on the buffer layer 211 so as to cover the semiconductor active layer 212, and a gate electrode 214 is disposed on the gate insulation layer 213.

An interlayer insulation layer 215 is formed on the gate insulation layer 213 so as to cover the gate electrode 214, and a source electrode 216 and a drain electrode 217 are disposed on the interlayer insulation layer 215 so as to each contact the semiconductor active layer 212 through a contact hole.

A structure of the thin-film transistor TR is not limited to the one described above, and may vary.

A passivation layer 218 is disposed to cover the thin-film transistor TR. The passivation layer 218 may be a single or plurality of insulation layers having a planarized top surface. The passivation layer 218 may be formed of at least one of an organic material and an inorganic material.

As shown in FIG. 3, a first electrode 221 of the organic light-emitting device EL, which is electrically connected to the thin-film transistor TR, is disposed on the passivation layer 218. The first electrode 221 has an independent island form according to pixels.

The first electrode 221 may include indium tin oxide (ITO), indium zinc oxide (IZO), zinc oxide (ZnO), or indium(III) oxide ($In_2O_3$), which has a high work function. If the organic light-emitting display of FIG. 1 is a top emission type display, wherein an image is realized in an opposite direction from the substrate 1, the first electrode 221 may further include a reflective layer (not shown) formed of silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

A pixel defining layer 219 is disposed on the passivation layer 218. The pixel defining layer 219 covers an edge of the first electrode 221 and exposes a center of the first electrode 221. The pixel defining layer 219 may cover the first area 31. Here, the pixel defining layer 219 may only cover part of the first area 31, for example, the edge of the first electrode 221.

The pixel defining layer 219 may include an organic insulating material, and may have a flat top surface by including an acryl-based resin, an epoxy-based resin, or polymer-based organic material such as polyimide.

An organic layer 223 is disposed on the first electrode 221 exposed through the pixel defining layer 219. A part of the organic layer 223 covers a part of the pixel defining layer 219 that covers the edge of the first electrode 221.

Here, although not illustrated in FIG. 3, the organic layer 223 may include at least three layers, i.e., first through third organic layers. The first organic layer may include a hole injection layer and a hole transport layer, the second organic layer may include a light-emitting layer, and the third organic layer may include an electron injection layer and an electron transport layer. Here, the first and third organic layers may be commonly applied to all pixels, as a common layer, and the second organic layer may be separately deposited according to colors of the pixels.

The hole injection layer may be formed of a phthalocyanine compound, such as copper phthalocyanine (CuPc), or a starburst type amine derivative, such as TCTA, m-MTDATA, or m-MTDAPB.

The hole transport layer may be formed of N,N'-bis(3-methylphenyl)-N,N'-diphenyl-(1,1-biphenyl)-4,4'diamine (TPD), N,N'-di(naphthalene-1-il)-N,N'-diphenyl benzidine (α-NPD), or the like. The electron injection layer may be formed of LiF, NaCl, CsF, $Li_2O$, BaO, or Liq. The electron transport layer may be formed of Alq3. The light emitting layer may include a host material and a dopant material.

Examples of the host material include tris(8-hydroxyquinolinato)aluminum (Alq3), 9, 10-di(naphthi-2-il)anthracene (AND), 3-tert-butyl-9,10-di(naphthi-2-il)anthracene (TBADN), 4,4'-bis(2,2-diphenyl-ethene-1-il)-4, 4'-dimethylphenyl (DPVBi), 4,4'-bisBis(2,2-diphenyl-ethene-1-il)-4,4'-dimethylphenyl (p-DMDPVBi), tert (9,9-diarylfluorene)s (TDAF), 2-(9,9'-spirobifluorene-2-il)-9,9'-spirobifluorene (BSDF), 2,7-bis(9,9'-spirobifluorene-2-il)-9, 9'-spirobifluorene (TSDF), bis(9,9-diarylfluorene)s (BDAF), 4,4'-bis(2,2-diphenyl-ethene-1-il)-4,4'-di-(tert-butyl)phenyl (p-TDPVBi), 1,3-bis(carbazole-9-il)benzene (mCP), 1,3,5-tris(carbazole-9-il)benzene (tCP), 4,4',4"-tris(carbazole-9-il) triphenylamine (TcTa), 4,4'-bis(carbazole-9-il)biphenyl (CBP), 4,4'-bisBis(9-carbazolyl)-2,Z-dimethyl-biphenyl (CBDP), 4,4'-bis(carbazole-9-il)-9,9-dimethyl-fluorene (DMFL-CBP), 4,4'-bis(carbazole-9-il)-9,9-bisbis(9-phenyl-9H-carbazole)fluorene (FL-4CBP), 4,4'-bis(carbazole-9-il)-9,9-di-tolyl-fluorene (DPFL-CBP), and 9,9-bis(9-phenyl-9H-carbazole)fluorene (FL-2CBP).

Examples of the dopant material include 4,4'-bis[4-(di-p-tolylamino)styryl]biphenyl (DPAVBi), 9,10-di(naph-2-tyl) anthracene (ADN), and 3-turt-butyl-9,10-di(naph-2-tyl)anthracene (TBADN).

A second electrode 222 is disposed on the organic layer 223. The second electrode 222 may be formed of a material having a low work function, such as Ag, Mg, Al, Pt, Pd, Au, Ni, Nd, Ir, Cr, Li, or Ca, and for example, may be formed of Mg or a metal including Mg alloy. The first electrode 221 may operate as an anode and the second electrode 222 may operate as a cathode, or vice versa.

In order to increase external light transmittance by not forming devices, such as a thin-film transistor, a capacitor, and an organic light-emitting device, in the second area 32, the second electrode 222 may not be formed in the second area 32. In order to not to form the second electrode 222 in the second area 32, the second electrode 222 has been formed in both of the first and second areas 31 and 32 of all pixels by using an open mask, and then the second electrode 222 in the second area 32 has been removed by patterning the second area 32. However, since such a method includes a separate mask process and reduces a manufacturing yield.

In one embodiment, a spacer 231 is disposed on the pixel defining layer 219 in such a way that the spacer 231 is tapered in a predetermined angle, so that the second electrode 222 is not formed in an area covered by the tapered spacer 231. Here, the spacer 231 may have a so-called negative spacer shape, wherein a length of a first surface of the spacer 231 is shorter than a length of a second surface of the spacer 231, wherein the first surface contacts the pixel defining layer 219 and the second surface is opposite to the first surface.

Here, in order for the spacer 231 to block a deposition material 131 emitted from a deposition source 130, the deposition source 130 may be disposed above one side of the substrate 1, instead of above a center of the substrate 1. Accordingly, the deposition material 131 is slantly emitted to the substrate 1, and thus the area where the second electrode 222 is not formed is formed as a part of the deposition material 131 slantly emitted is blocked by the spacer 231.

Figure 4:
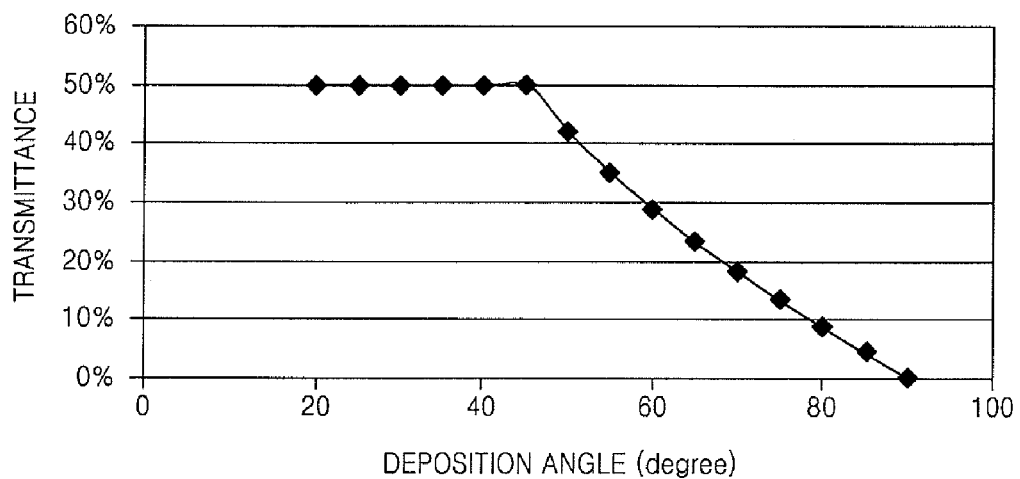
FIG. 4 is a graph illustrating transmittance with respect to a deposition angle.

FIG. 4 is a graph illustrating transmittance with respect to a deposition angle. Referring to FIGS. 3 and 4, when the deposition angle is about 90°, i.e., when the deposition source 130 is disposed right above a deposition area, external light transmittance is about 0% since the second electrode 222 is thickly deposited throughout the deposition area. As the deposition angle decreases from about 90°, i.e., as the deposition material 131 is slantly emitted from the deposition source 130 on the substrate 1 at a predetermined angle with respect to the substrate 1 as the deposition source 130 is disposed farther from the center of the deposition area, an amount of the deposition material 131 deposited on the substrate 1 decreases, and thus the external light transmittance is increased. As a result, when the deposition angle is about 42° or lower, a part of the deposition material 131 is blocked by the spacer 231, thereby forming the area where the second electrode 222 is not formed. Accordingly, the external light transmittance may be maintained at about 50%.

As such, the part of the deposition material 131 slantly incident on the substrate 1, at a predetermined angle with respect to a deposition surface of the substrate 1, is blocked by forming the spacer 231 on the pixel defining layer 219. Accordingly, an opening 222a, where the deposition material 131 is not deposited throughout a predetermined area from an area where the spacer 231 and the pixel defining layer 219 contact each other, is formed, thereby forming the second electrode 222 only on a part of the second area 32 without having to perform a separate patterning process. Thus, the external light transmittance may be increased.

Figure 5:
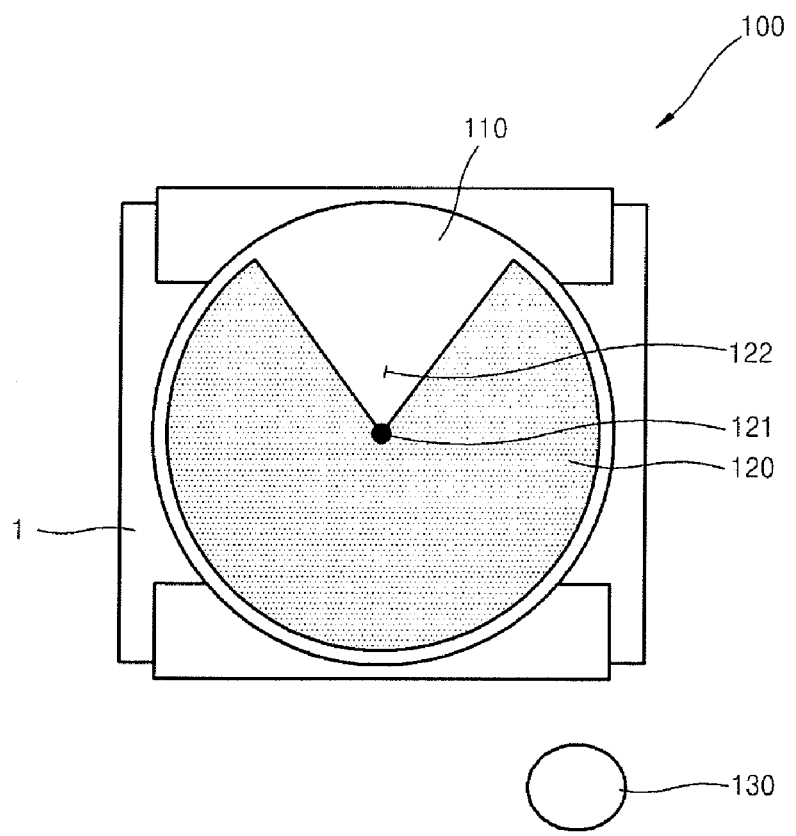
FIG. 5 is a plan view of a thin film deposition apparatus according to an embodiment.

A thin film deposition apparatus according to an embodiment will now be described in detail. FIG. 5 is a plan view of a thin film deposition apparatus 100 according to an embodiment. Referring to FIG. 5, the thin film deposition apparatus 100 includes a shutter 110, a blocking member 120, and a deposition source 130. Also, the substrate 1 is disposed in the thin film deposition apparatus 100.

As described above, in the organic light-emitting display of FIG. 3, the spacer 231 is disposed on the pixel defining layer 219 thereby blocking the part of the deposition material 313 slantly incident on the deposition surface of the substrate 1 at a predetermined angle. Accordingly, the second electrode 222 having the opening 222a may be formed. Here, the second electrode 222 having the opening 222a may be formed without having to rotate the substrate 1.

However, when the second electrode 222 is formed without rotating the substrate 1, a deposited amount of the deposition material 131 may differ according to an emitted angle from the deposition source 130. Accordingly, a thickness of the second electrode 222 may be irregular, and thus light transmittance in a panel may be irregular. In other words, since the external light transmittance differs according to the deposition angle of the deposition material 131 as shown in FIG. 4, in order to form the second electrode 222 having a uniform thickness on the substrate 1, the second electrode 222 may be formed while rotating the substrate 1 at a uniform speed.

However, when the second electrode 222 is formed while rotating the substrate 1 at a uniform speed, each area of the substrate 1 repeatedly moves toward and away from the deposition source 130. Here, when an area of the substrate 1 moves toward the deposition source 130, an incident angle of the deposition material becomes almost vertical. Accordingly, the deposition material is deposited on a neighboring area of the area where the spacer 231 is formed, i.e., an area where the second electrode 222 is not to be formed, and thus overall transmittance of the organic light-emitting display may deteriorate.

Accordingly, the thin film deposition apparatus 100 according to the current embodiment further includes the blocking member 120, through which only the deposition material 131 passes to the area where a predetermined opening is formed, besides the shutter 110 that prevents the deposition material 131 from being deposited on the substrate 1 when deposition is not performed. The blocking member 120 will now be described in detail.

As described above, in order to prevent the deposition material 131 of FIG. 3 from being deposited on a partial area of the substrate 1, the spacer 231 of FIG. 3 is formed on the pixel defining layer 210 of FIG. 3, and the part of the deposition material 131 is blocked by the spacer 231 by slantly emitting the deposition material 131 on the deposition surface of the substrate 1 at a predetermined angle. In other words, as shown in FIG. 4, a predetermined level of transmittance or above is obtained only when the deposition angle of the deposition material 131 with respect to the deposition surface of the substrate 1 is about 42° or below. In other words, the deposition material 131 is only deposited on an area where the deposition angle of the deposition material 131 with respect to the deposition surface of the substrate 1 is a predetermined value or above, for example, about 42° or above, and is not deposited in other areas. Here, an area where the deposition material 131 is not formed may be covered by some kind of shield.

Accordingly, the blocking member 120 of the thin film deposition apparatus 100 may have a fan shape and may partially include the opening 122 so that the deposition material 131 is deposited on the substrate 1 only through the opening 122. Here, the opening 122 of the blocking member 120 may be spaced apart from the deposition source 130 as far as possible because only when the opening 122 is spaced apart from the deposition source 130 at a predetermined distance or above, the deposition material 131 emitted from the deposition source 130 may be incident on the substrate 1 at a predetermined angle or below instead of perpendicular to the substrate 1. Also, only when the deposition material 131 is incident on the deposition surface of the substrate 1 at the predetermined angle or below, the part of the deposition material 131 is blocked by the spacer 231, and thus the opening 222a of FIG. 3, where the second electrode 222 is not formed on the substrate 1, may be formed.

In other words, even when the substrate 1 rotates, the deposition material 131 is deposited only on the area where the deposition angle with respect to the deposition surface of the substrate 1 has a predetermined value or below and is not deposited in the remaining area due to the blocking member 120. Also, the opening 222a is formed on the second electrode 222 where the deposition angle with respect to the deposition surface of the substrate 1 has the predetermined value or below by the spacer 231, and thus light transmittance is improved. As a result, light transmittance is maintained at a predetermined level or above throughout the substrate 1.

According to at least one of the disclosed embodiments, a cathode is easily deposited while providing a substantially uniform thickness of the cathode.

While the disclosed embodiments have been described with reference to the accompanying drawings, it will be understood, by those of ordinary skill in the art that various changes in form and details may be made therein without departing from the scope of the following claims.

What is claimed is:

1. A method of manufacturing an organic light-emitting display, the method comprising:

dividing each of a plurality of pixels disposed on a substrate into a first area emitting light and a second area through which external light penetrates;

forming a plurality of pixel circuit units, each comprising at least one thin-film transistor, on the first area of each of the pixels;

forming a plurality of first electrodes on the first area of each of the pixels, which are respectively electrically connected to each of the pixel circuit units and are patterned in an island form so as to be separated from each other in each of the pixels;

forming a plurality of organic layers so as to cover at least part of each of the first electrodes, wherein each of the organic layers comprises a light-emitting layer;

forming a plurality of spacers between the neighboring organic layers; and depositing a deposition material on the first and second areas to form a second electrode having an opening on at least one side of each of the spacers.

2. The method of claim 1, wherein the deposition material is emitted from a deposition source that is spaced apart from a center of the substrate on the first and second areas.

3. The method of claim 2, wherein the deposition material is deposited while the substrate rotates with respect to the deposition source.

4. The method of claim 2, wherein the deposition material is deposited such that at least part of the deposition material emitted from the deposition source is blocked by a blocking member.

5. The method of claim 4, wherein the deposition material is deposited while the blocking member is fixed with respect to the deposition source.

6. The method of claim 4, wherein the blocking member has a fan shape and has an opening on at least one side of the blocking member, and wherein the opening is disposed so as to provide the maximum distance between the opening and the deposition source.

7. The method of claim 4, wherein the blocking member only passes through part of the deposition material emitted from the deposition source, which is incident on the substrate at an angle less than a predetermined angle with respect to a deposition surface of the substrate.

8. The method of claim 2, wherein the deposition material is deposited on the substrate at an angle less than 90° with respect to a deposition surface of the substrate, and wherein at least part of the deposition material incident on the substrate is blocked by the spacers.

* * * * *